(12) United States Patent
Son et al.

(10) Patent No.: US 7,576,354 B2
(45) Date of Patent: Aug. 18, 2009

(54) ORGANIC LIGHT EMITTING DIODE DISPLAY AND METHOD OF FABRICATING THE SAME

(75) Inventors: Hyun-Chul Son, Yongin-si (KR);
Moo-Soon Ko, Yongin-si (KR);
Woong-Sik Choi, Yongin-si (KR);
Ji-Yeon Baek, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 69 days.

(21) Appl. No.: 11/641,844

(22) Filed: Dec. 20, 2006

(65) Prior Publication Data

US 2007/0138478 A1 Jun. 21, 2007

(30) Foreign Application Priority Data

Dec. 20, 2005 (KR) .................. 10-2005-0126111
Oct. 16, 2006 (KR) .................. 10-2006-0100480

(51) Int. Cl.
*H01L 51/40* (2006.01)
*H01L 35/24* (2006.01)
*H01L 51/00* (2006.01)

(52) U.S. Cl. .................. 257/40; 257/79; 257/910; 257/E51.022; 257/E25.032; 257/E51.005; 257/E29.151; 438/99; 438/149

(58) Field of Classification Search .................. 438/637, 438/638, 99, 149, FOR. 184, FOR. 201; 257/E21.579, 257/40, 79, 910, E51.022, E25.032, E51.005, 257/E29.151
See application file for complete search history.

(56) References Cited

U.S. PATENT DOCUMENTS

| 6,690,110 | B1 | 2/2004 | Yamada et al. |
| 6,723,576 | B2 | 4/2004 | Nozawa et al. |
| 6,727,645 | B2 | 4/2004 | Tsujimura et al. |
| 7,053,548 | B2 | 5/2006 | Nakanishi |
| 7,141,817 | B2 * | 11/2006 | Nishi et al. ............ 257/40 |
| 2004/0183083 | A1 | 9/2004 | Koo |
| 2004/0217355 | A1 | 11/2004 | Yoneda |
| 2005/0082968 | A1 * | 4/2005 | Choi et al. ............ 313/506 |
| 2005/0140277 | A1 * | 6/2005 | Suzuki et al. ......... 313/504 |
| 2005/0200273 | A1 * | 9/2005 | Nozawa ................ 313/503 |
| 2007/0120126 | A1 * | 5/2007 | Sung et al. ............ 257/59 |

FOREIGN PATENT DOCUMENTS

| JP | 2001-109395 | 4/2001 |
| JP | 2003-015548 | 1/2003 |
| JP | 2003-295792 | 10/2003 |
| JP | 2004-055529 | 2/2004 |
| JP | 2004-264634 | 9/2004 |
| KR | 10-2004-0071363 A | 8/2004 |
| KR | 10-2006-0059745 A | 6/2006 |

* cited by examiner

*Primary Examiner*—Michelle Estrada
(74) *Attorney, Agent, or Firm*—Lee & Morse, P.C.

(57) ABSTRACT

An organic light emitting diode display may have a power supply line that is coplanar with a first pixel electrode of an organic light emitting element. The power supply line, first source and drain electrodes of a first thin film transistor (TFT), second source and drain electrodes of a second TFT, a data line, and an upper electrode of a storage capacitor constitute source/drain wire lines. In addition to the power supply line, any one(s) of or all of the source/drain wire lines may be coplanar with the first pixel electrode.

23 Claims, 15 Drawing Sheets

ORGANIC LIGHT EMITTING DIODE DISPLAY AND METHOD OF FABRICATING THE SAME

BACKGROUND OF THE INVENTION

1. Field of the Invention

The present invention relates to an organic light emitting diode display and a method of fabricating the same. More particularly, the present invention relates to an organic light emitting diode display and a method of fabricating the same, which may reduce or prevent deterioration in image quality and may simplify the manufacturing process.

2. Description of the Related Art

An organic light emitting diode display displays an image by driving N×M organic light emitting elements with a voltage or current. The light emitting elements are emissive display elements that electrically excite an organic compound to emit light.

Since the organic light emitting element has diode characteristics, the organic light emitting element is also referred to as an organic light emitting diode (OLED). The organic light emitting element may include an anode electrode that is a hole injection electrode, an organic layer including a light emitting layer, and a cathode electrode that is an electron injection electrode.

When holes and electrons are injected into the organic layer, exitons obtained by combining the injected holes and electrons may be transitioned from an excited state to a ground state, so that light is emitted from the organic layer.

The OLED display including the aforementioned organic light emitting elements may include a substrate having a pixel driving circuit. The substrate may include a buffer layer, and the pixel driving circuit including a plurality of thin film transistors (TFTs) may be formed on the buffer layer.

The pixel driving circuit may include at least two TFTs and a storage capacitor for three, e.g., red, green, and blue, sub-pixels constituting an organic light emitting element.

A first TFT of the two or more TFTs may serve as a switching TFT for selecting an element to emit light from among a plurality of organic light emitting elements. In general, a first gate electrode of the first TFT may be coupled to a scan line, a first source electrode thereof may be coupled to a data line perpendicular to the scan line, and a first drain electrode thereof may be coupled to a lower electrode of the storage capacitor.

A second TFT of the two or more TFTs may serve as a driving TFT for applying a driving voltage used to emit light from the organic layer of the selected organic light emitting element. In general, a second gate electrode of the second TFT may be coupled to the lower electrode of the storage capacitor, a second source electrode thereof may be coupled to a power supply line, and a second drain electrode may be coupled to the anode electrode.

A process of forming the aforementioned pixel driving circuit and the organic light emitting element on a sub-pixel region may be as follows.

In order to form the pixel driving circuit, the buffer layer may be formed at a side of the substrate, and first and second semiconductor layers may be formed on first and second TFT regions of the buffer layer, respectively. The first and second semiconductor layers may include source, drain, and channel regions, and may be made of, e.g., polysilicon.

In addition, a single first semiconductor layer and a single second semiconductor layer may be formed in the sub-pixel region. Therefore, twice as many semiconductor layers may be formed in the sub-pixel region than on a remainder of the substrate.

Then, a gate insulating layer may be formed, and gate wire lines may be formed on the gate insulating layer. The gate wire lines represent conductive materials formed on the gate insulating layer. Here, the gate wire lines represent the first gate electrode of the first TFT, the second gate electrode of the second TFT, the scan line connected to the first gate electrode, and the lower electrode of the storage capacitor connected to the second gate electrode.

Next, an interlayer insulating film having a plurality of via holes may be formed on the aforementioned structure, and source/drain wire lines may be formed on the interlayer insulating film. The source/drain wire lines represent conductive materials formed on the interlayer insulating film.

Here, the source/drain wire lines represent the first source and drain electrodes of the first TFT, the second source and drain electrodes of the second TFT, the data line coupled to the first source electrode, the power supply line coupled to the second source electrode, and an upper electrode of the storage capacitor coupled to the power supply line. In this case, the first drain electrode is also coupled to the lower electrode of the storage capacitor.

Next, a planarization layer may be formed on the aforementioned structure, and the organic light emitting element may be formed on the planarization layer. The organic light emitting element may include first and second pixel electrodes and an organic layer interposed between the electrodes.

Here, in general, the first pixel electrode disposed below the second pixel electrode may serve as an anode electrode, and the second pixel electrode may serve as a cathode electrode. The first pixel electrode may be coupled to the second drain electrode of the second TFT.

In addition, the organic layer may be constructed as a multilayer structure including an electron transport layer ETL and a hole transport layer HTL. The organic layer may further include an electron injection layer EIL and a hole injection layer HIL.

In the organic light emitting diode display having the aforementioned construction, the source/drain wire lines are generally composed Ti/Al/Ti. Al has a specific resistance of 2.2× 10-6 Ω·cm. Accordingly, the power supply line including Al has a relatively high specific resistance.

Therefore, when IR drop occurs along the power supply line, problems, e.g., lack of brightness uniformity and crosstalk, due to the IR drop occur. As the size of the OLED display increases, these problems increase.

In addition, there is a problem in that the source/drain wire lines and the first pixel electrode are formed on different layers from each other.

Accordingly, a fine metal mask for forming the source/drain wire lines on the interlayer insulating film and a fine metal mask for forming the first pixel electrode on the planarization layer are separately provided. Therefore, layer-forming processes using the masks have to be separately performed. Therefore, cost reduction of the OLED display is limited.

SUMMARY OF THE INVENTION

The present invention is therefore directed to an OLED display and method of making the same, which substantially overcomes one or more of the problems due to the limitations and disadvantages of the related art It is therefore a feature of an embodiment of the present invention to provide an OLED display having a reduced IR drop.

It is therefore another feature of an embodiment of the present invention to provide an OLED display allowing use of a simplified manufacturing process.

The present invention also provides a method of effectively fabricating the aforementioned OLED display.

At least one of the above and other features and advantages of the present invention may be realized by providing an organic light emitting diode display, including a pixel driving circuit including a first TFT, a second TFT, and a storage capacitor, an organic light emitting element including a first pixel electrode, a second pixel electrode on the first pixel electrode, and an organic layer between the first and the second electrode, the organic light emitting element being on the pixel driving circuit, and a power supply line that is coplanar with the first pixel electrode.

The first pixel electrode may include Ag, e.g., may include ITO/Ag/ITO.

At least one of first source and drain electrodes of the first TFT, a data line, second source and drain electrodes of the second TFT, and an upper electrode of the storage capacitor may be coplanar with the power supply line. The coplanar elements may be formed on a planarization layer.

The power supply line may be integral with the second source electrode of the second TFT and/or the upper electrode of the storage capacitor. The first pixel electrode may be integral with the second drain electrode of the second TFT. The first source electrode of the first TFT may be integral with the data line.

At least one of the above and other features and advantages of the present invention may be realized by providing a method of fabricating an organic light emitting diode display, the method including forming first and second semiconductor layers of first and second TFTs, respectively, on a sub-pixel region of a substrate, forming a gate insulating layer, forming a first gate electrode of the first TFT, a scan line connected to the first gate electrode, a second gate electrode of the second TFT, and a lower electrode of a storage capacitor connected to the second gate electrode, forming an interlayer insulating film, forming an upper electrode of the storage capacitor, forming a data line, forming first source and drain electrodes of the first TFT, forming second source and drain electrodes of the second TFT, forming a power supply line coupled to the second source electrode and the upper electrode of the storage capacitor, forming a first pixel electrode coupled to the second drain electrode, the first pixel electrode being coplanar with the power supply line, and sequentially stacking an organic layer and a second pixel electrode on the first pixel electrode.

Before forming the power supply line and the first pixel electrode, a planarization layer may be formed. Forming the planarization layer may be performed after at least one of forming the interlayer insulating film, the upper electrode of the storage capacitor, the data line, the first source and drain electrodes of the first TFT, and the second source and drain electrodes of the second TFT.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
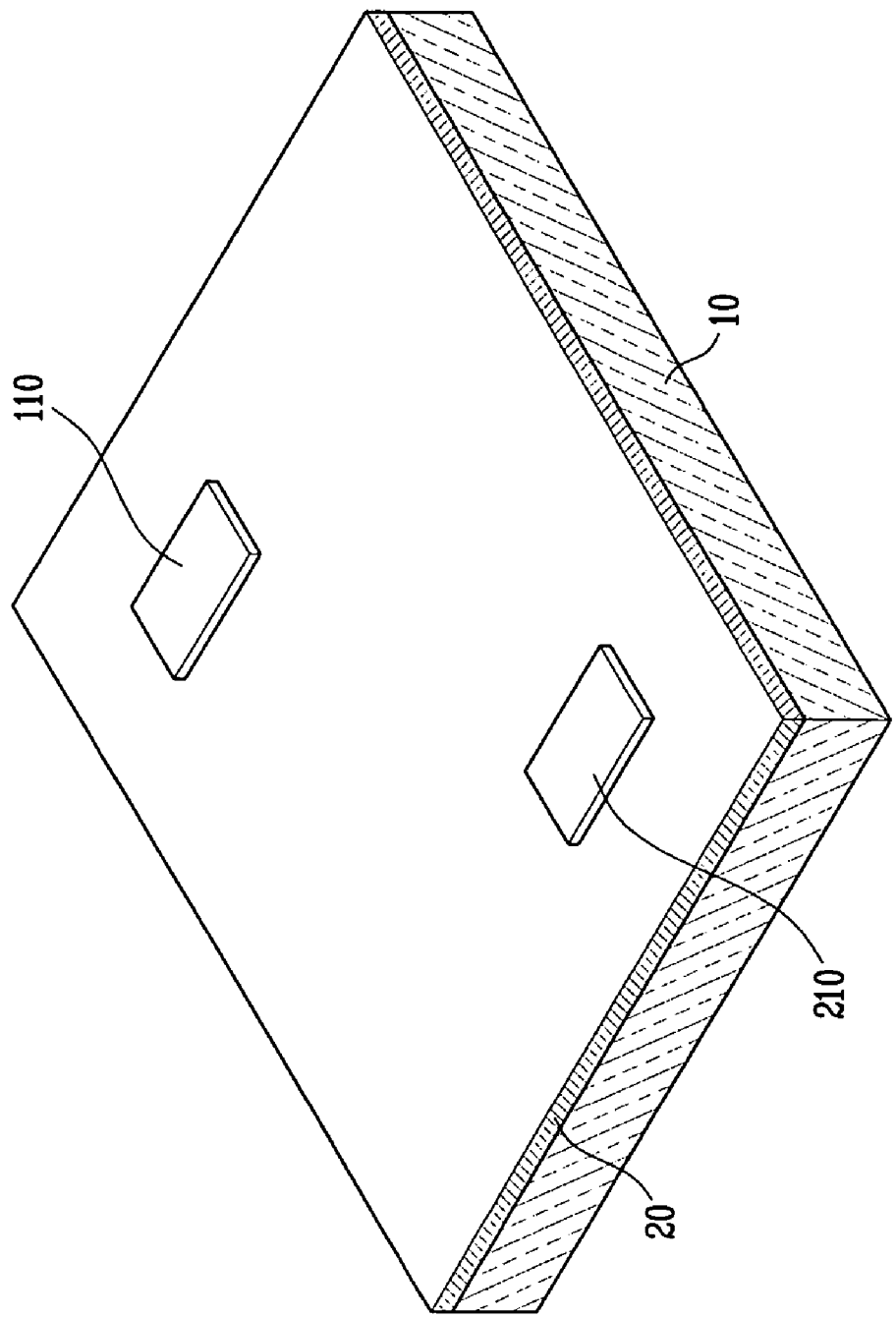
FIG. 1 illustrates a perspective view of a stage in which first and second semiconductor layers are formed in a method of fabricating an OLED display according to a first embodiment of the present invention.

Korean Patent Applications Nos. 10-2005-0126111 filed on Dec. 20, 2005, and 10-2006-0100480 filed on Oct. 16, 2006, in the Korean Intellectual Property Office, and entitled: "Organic Light Emitting Diode Display and a Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the embodiments described later, a pixel driving circuit with a 2Tr-1Cap structure constructed with two thin film transistors (TFTs) and a storage capacitor is exemplified. However, the structure of the pixel driving circuit is not limited thereto, but may be modified in various forms according to applications.

Figure 3:
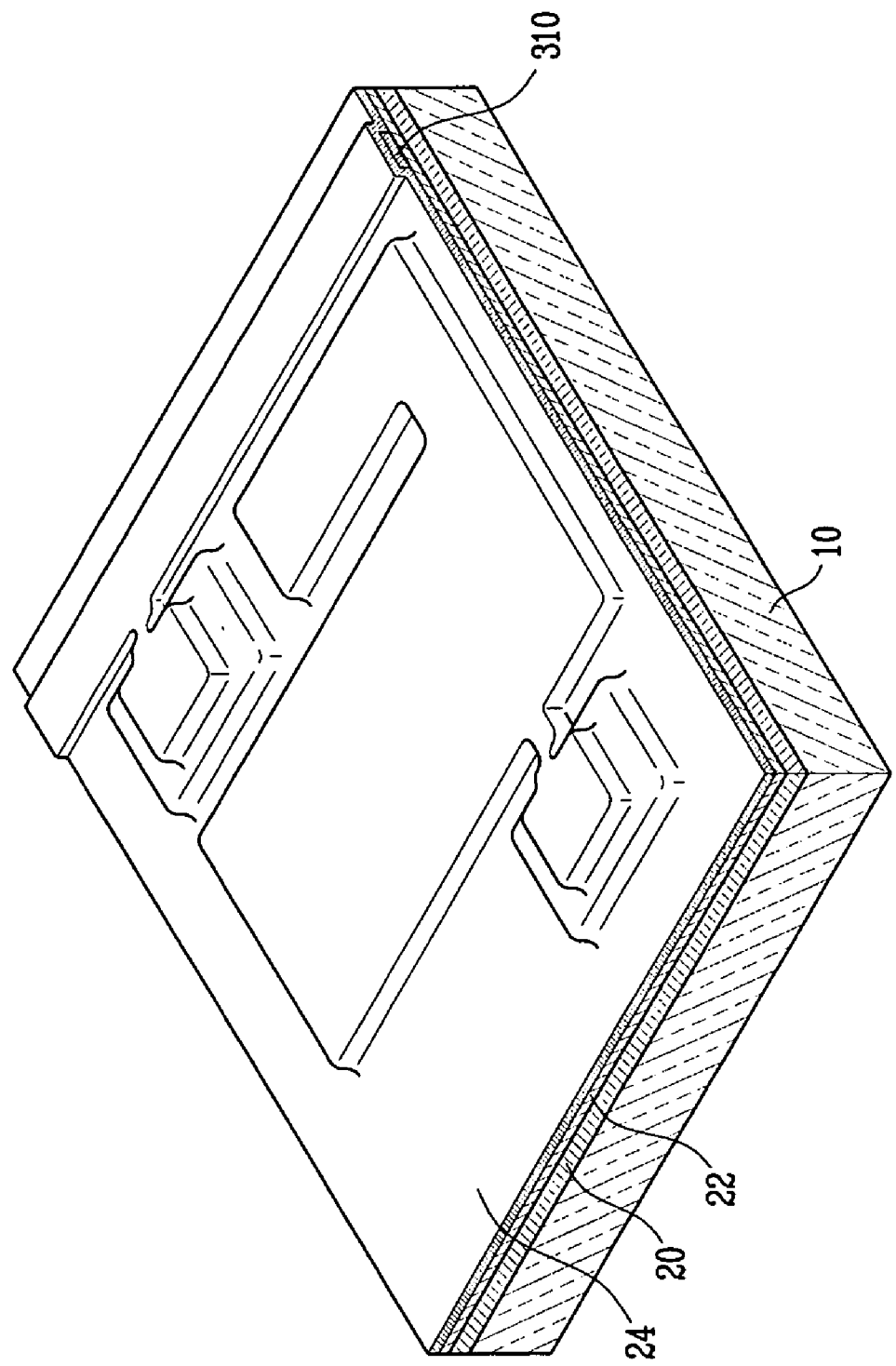
FIG. 3 illustrates a perspective view showing a state in which an interlayer insulating film is formed on the substrate of FIG. 2.
Figure 4:
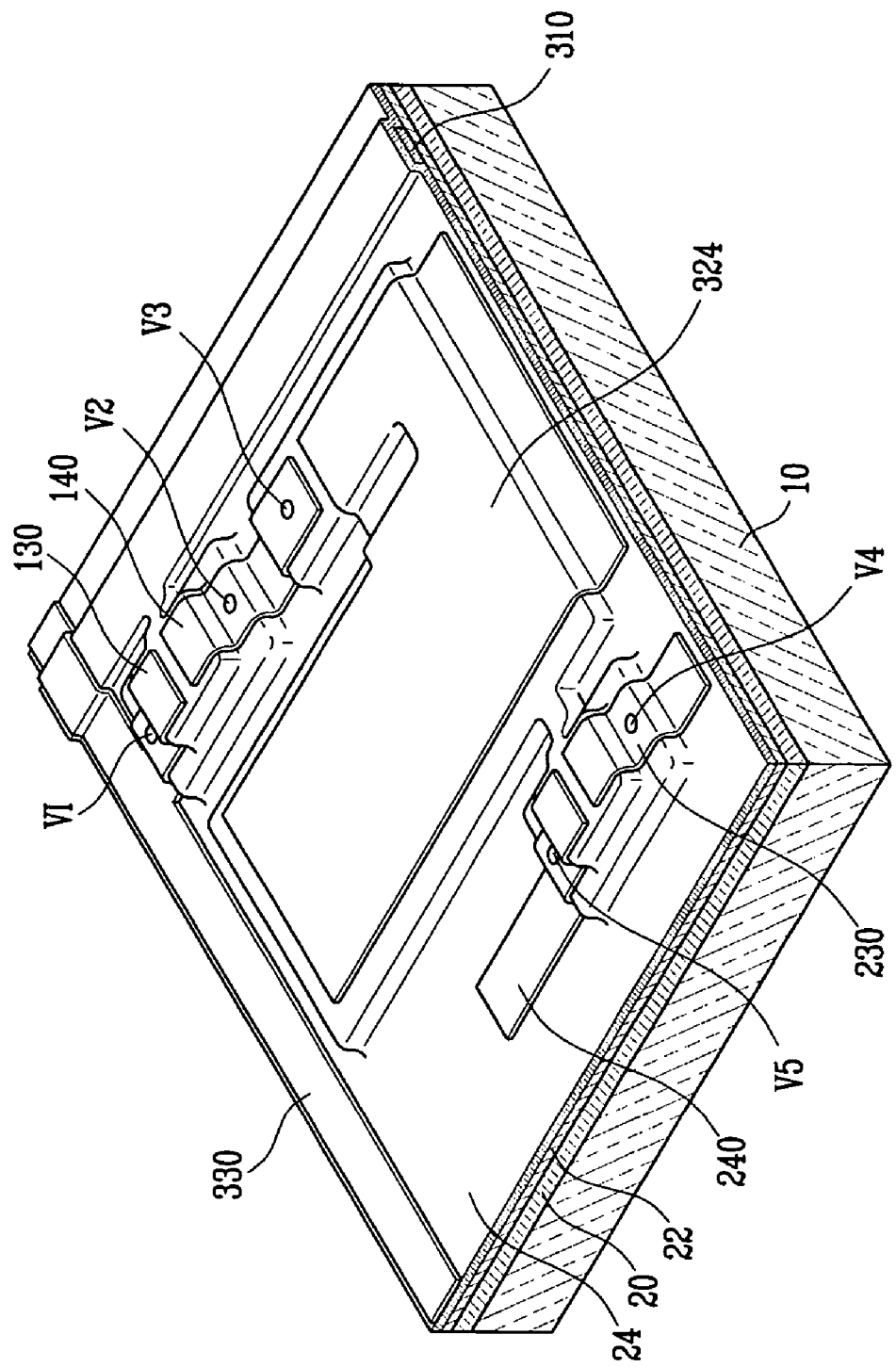
FIG. 4 illustrates a perspective view of a stage in which portions of source/drain wire lines are formed on the substrate of FIG. 3.
Figure 5:
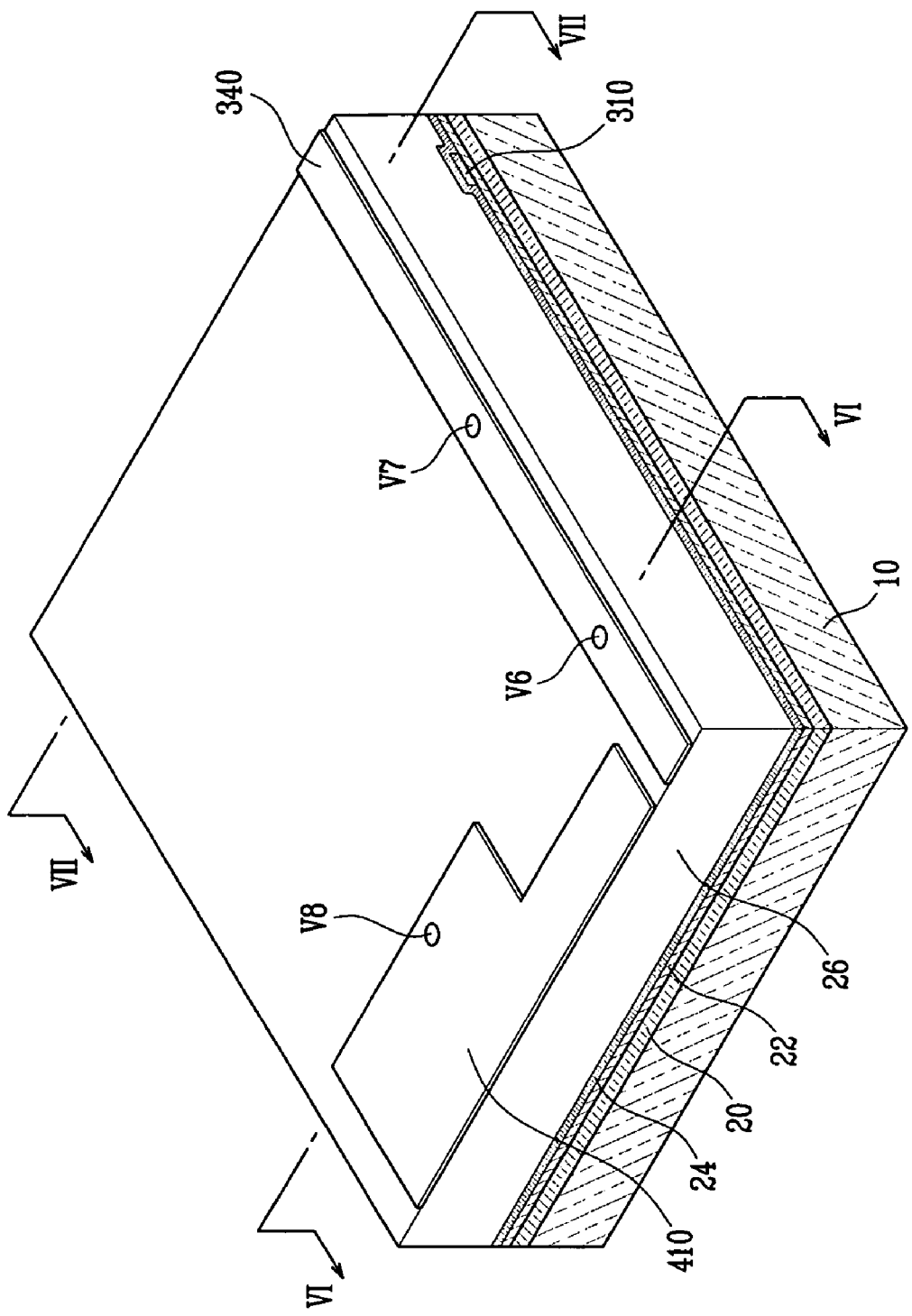
FIG. 5 illustrates a perspective view of a stage in which a planarization layer, a first pixel electrode, and a power supply line are formed on the substrate of FIG. 4.
Figure 6:
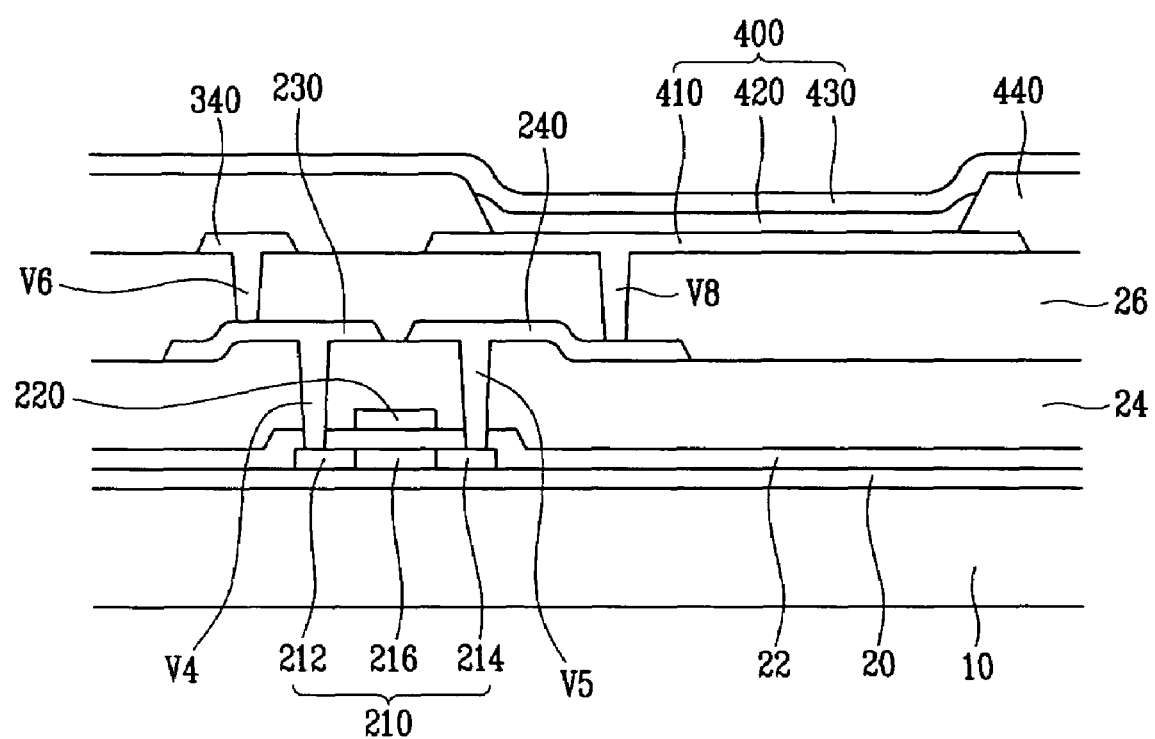
FIG. 6 illustrates a cross-sectional view taken along line VI-VI of FIG. 5.
Figure 7:
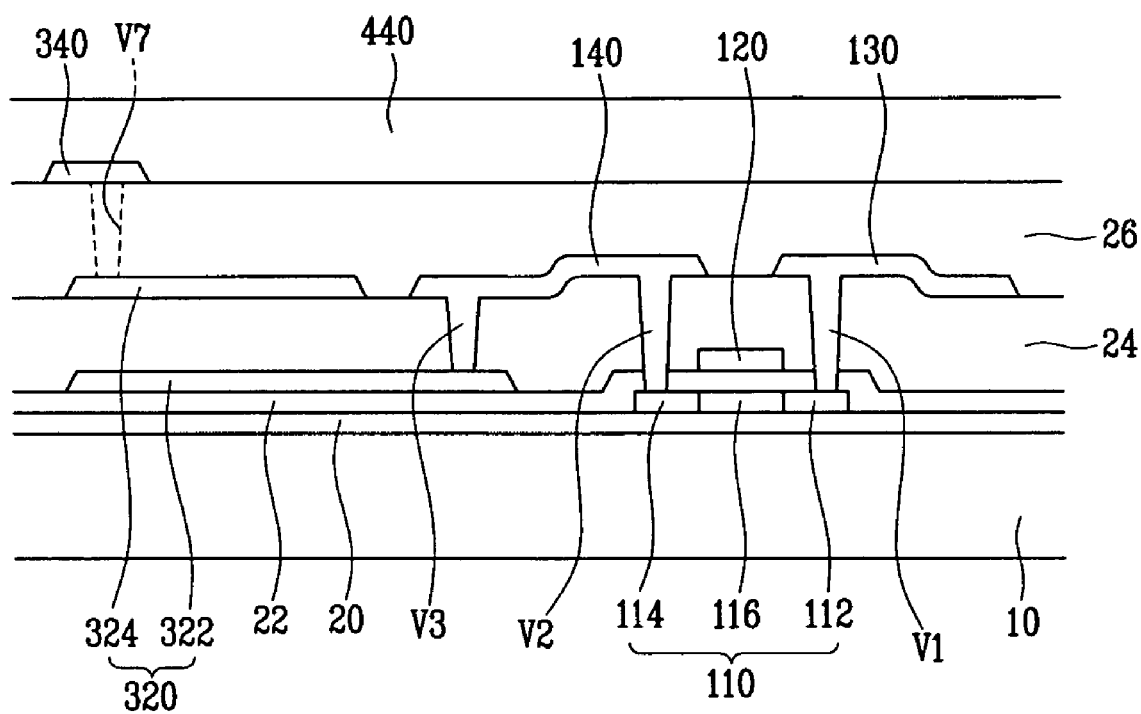
FIG. 7 illustrates a cross-sectional view taken along line VII-VII of FIG. 5.

FIGS. 1 to 5 illustrate perspective views of main components in order to explain a method of fabricating an organic light emitting diode display according to a first embodiment of the present invention. FIG. 6 illustrates a cross-sectional view taken along line VI-VI of FIG. 5, and FIG. 7 illustrates a cross-sectional view taken along line VII-VII of FIG. 5, assuming that a light emitting element has been formed on a substrate of FIG. 5.

An OLED display according to an embodiment of the present invention may include a substrate 10. The substrate 10 may be a transparent, e.g., glass, opaque, e.g., a resin, and/or flexible, e.g., a metal substrate that is thin enough to bend.

In order to simplify the illustrations, in FIGS. 1 to 5, only a substrate in a region where a pixel driving circuit is formed of a single sub-pixel region is shown.

As shown in FIG. 1, a buffer layer 20 may be formed on the substrate 10, and first and second semiconductor layers 110 and 210 may be formed on first and second TFT regions, respectively, in the buffer layer 20. As shown in FIGS. 6 and 7, the first and second semiconductor layers 110 and 210 may include source regions 112 and 212, drain regions 114 and 214, and channel regions 116 and 216, respectively. The first and second semiconductor layers 110 and 210 may be polysilicon.

Figure 2:
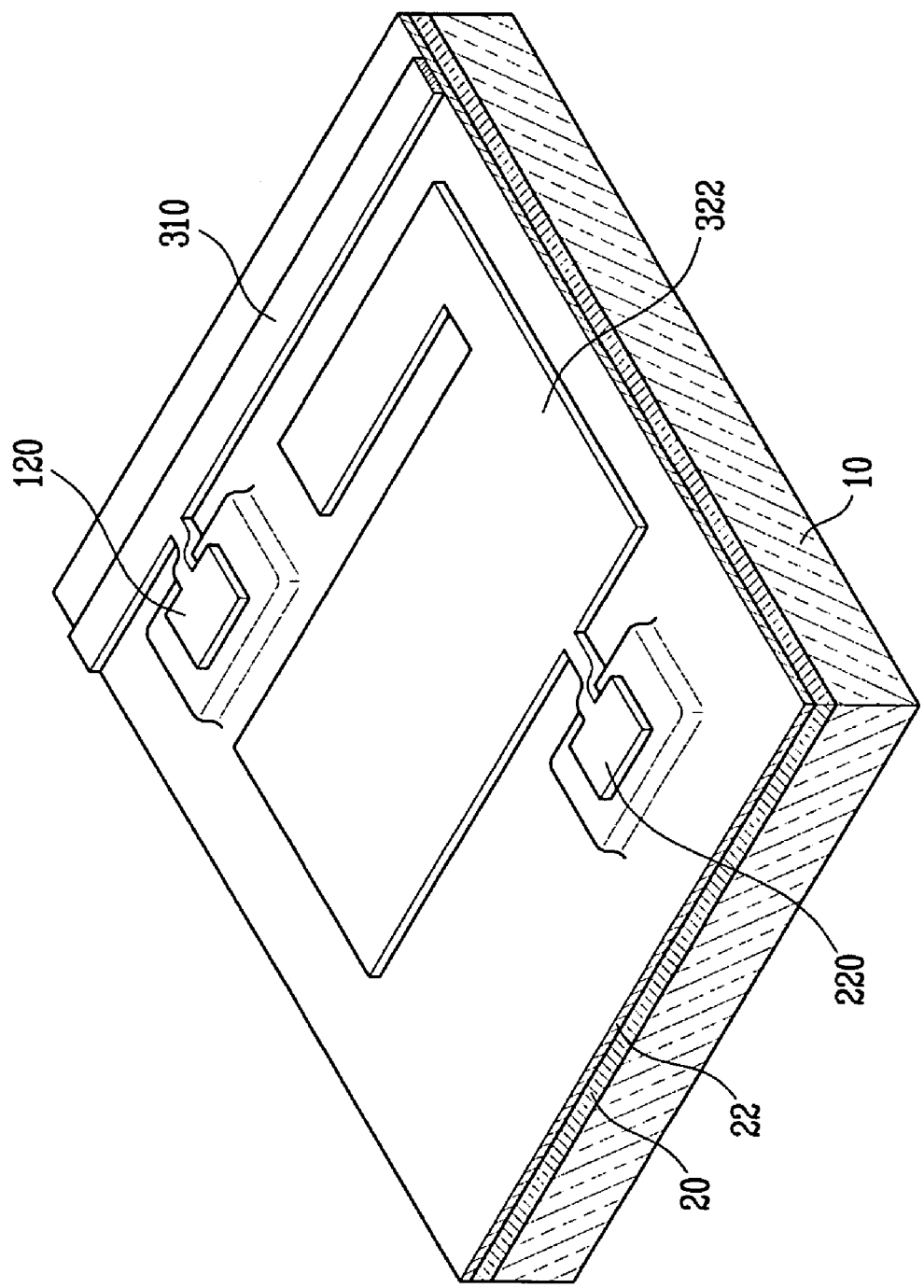
FIG. 2 illustrates a perspective view of a stage in which a gate insulating layer and gate wire lines are formed on a substrate of FIG. 1.

Next, as shown in FIG. 2, a gate insulating layer 22 may be formed. A first gate electrode 120, a scan line 310, a second gate electrode 220, and a lower electrode 322 of a storage capacitor 320 (see FIGS. 6 and 7) may be formed on the gate insulating layer 22. The scan line 310 and the first gate electrode 120 may be integrated into a single structure. The second gate electrode 220 and the lower electrode 322 may be integrated into a single structure.

As shown in FIGS. 3 and 4, an interlayer insulating film 24 may be formed thereon. A data line 330, first source and drain electrodes 130 and 140 of a first TFT, an upper electrode 324 of the storage capacitor 320, and second source and drain electrodes 230 and 240 of a second TFT may be formed on the interlayer insulating film 24. The data line 330 may be made of, e.g., Ti/Al/Ti.

The data line 330 may be perpendicular to the scan line 310. The data line 330 and the first source electrode 130 may be integrated into a single structure. The first source electrode 130 may be electrically connected to the source region 112 of the first semiconductor layer 110 through a first via hole V1.

The drain electrode 140 may be electrically connected to the drain region 114 of the first semiconductor layer 110 through a second via hole V2. The drain electrode 140 may be electrically connected to the lower electrode 322 of the storage capacitor 320 through a third via hole V3.

The second source electrode 230 of the second TFT may be electrically connected to the source region 212 of the second semiconductor layer 210 through a fourth via hole V4. The second drain electrode 240 may be electrically connected to the drain region 214 of the second semiconductor layer 210 through a fifth via hole V5.

Next, as shown in FIG. 5, a planarization layer 26 may be formed. A power supply line 340 and a first pixel electrode 410 may be formed on the planarization layer 26. In this case, the first pixel electrode 410 may be a hole injection electrode, and may be serve as an anode electrode. The power supply line 340 and the first pixel electrode 410 may be a multilayer structure and may include Ag, e.g., ITO/Ag/ITO.

The power supply line 340 may be perpendicular to the scan line 310 and may face the data line 330. In addition, the power supply line 340 may be electrically connected to the second source electrode 230 through a sixth via hole V6 and to the upper electrode 324 of the storage capacitor 320 through a seventh via hole V7.

The first pixel electrode 410 may be electrically connected to the second drain electrode 240 through an eighth via hole V8.

Next, as shown in FIGS. 6 and 7, a pixel defining layer 440 may be formed to expose the first pixel electrode 410, and an organic layer 420 and a second pixel electrode 430 may be formed on the first pixel electrode 410, thereby forming an organic light emitting element 400. Here, the second pixel electrode 430 may be an electron injection electrode, and may serve as a cathode electrode.

After all the aforementioned structures of the substrate 10 are formed by the aforementioned processes, encapsulation may be provided, e.g., using an encapsulation glass, a metal cap, or an encapsulation film (not shown).

The power supply line 340 and the first pixel electrode 410 may be conductive, and may include Ag, e.g., may be, ITO/Ag/ITO. Since Ag has a specific resistance of $1.62 \times 10^{-6}$ Ω·cm, which is lower than that of Al, IR drop may be reduced. Therefore, unnecessarily consumed voltage can be reduced, so that it is possible to reduce power consumption. In addition, vertical cross-talk may be reduced, so that images may be improved.

Figure 8:
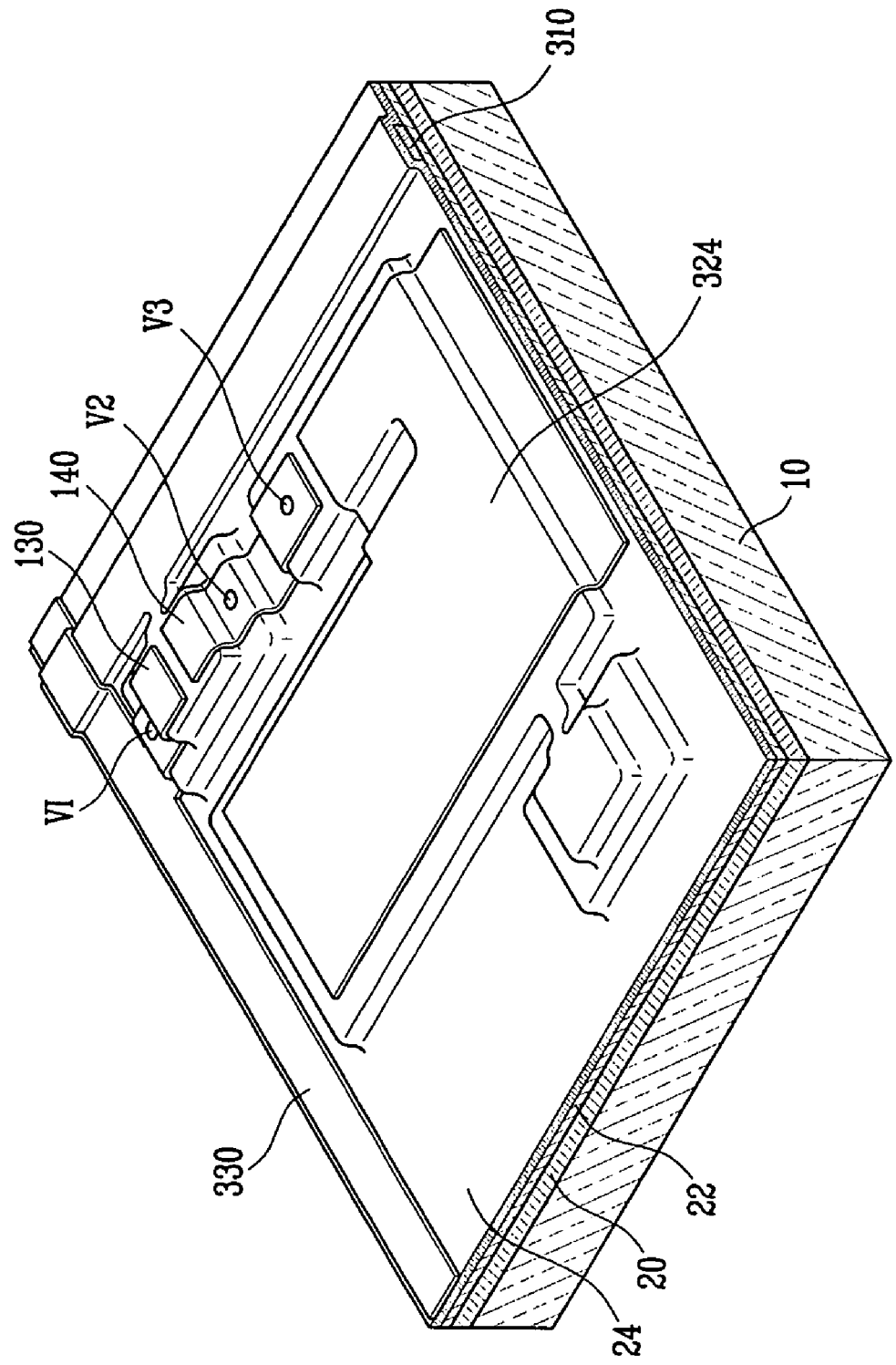
FIG. 8 illustrates a perspective view of a stage in which portions of source/drain wire lines are formed on the substrate of FIG. 3 in a method of fabricating an OLED display according to a second embodiment of the present invention.
Figure 9:
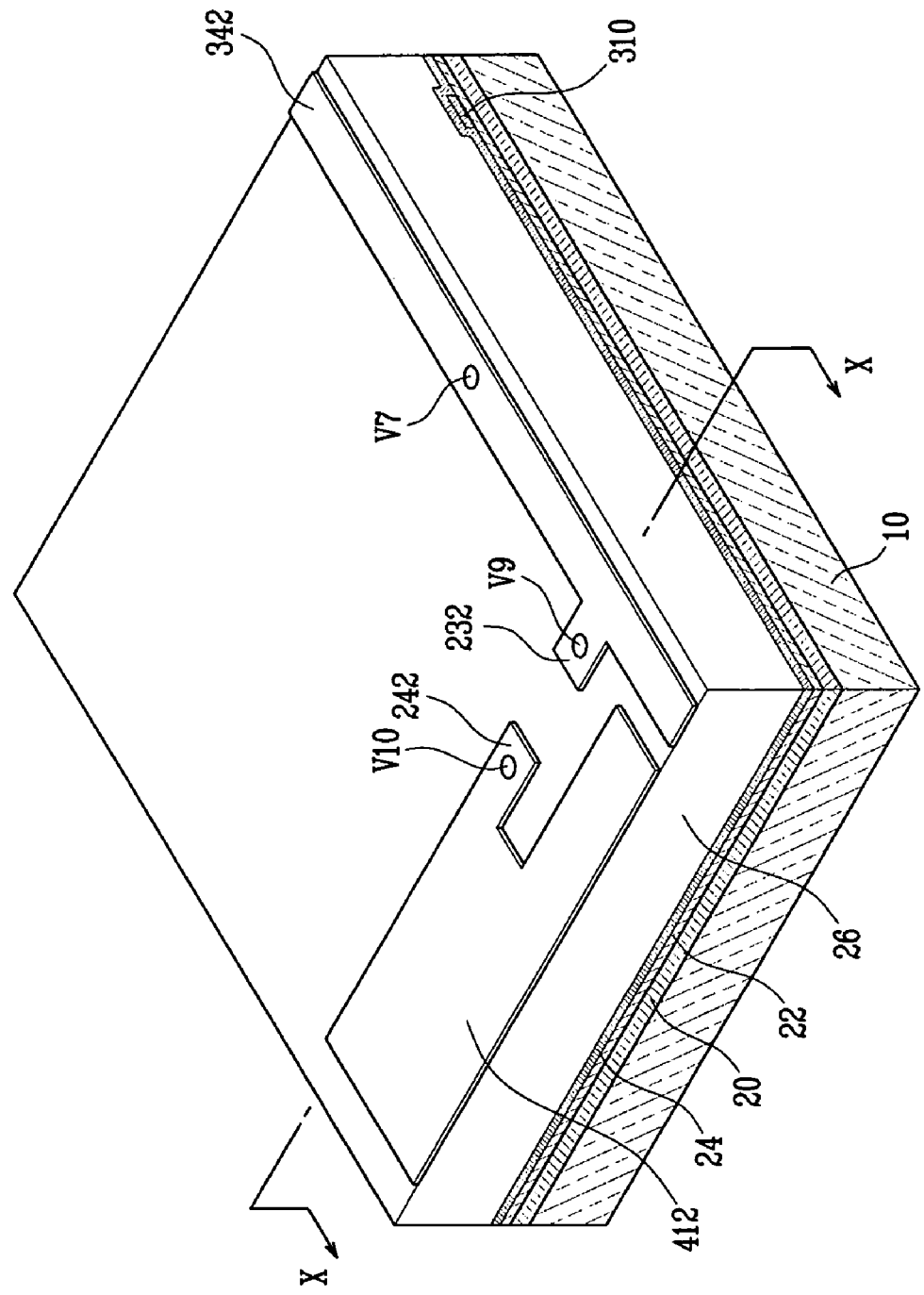
FIG. 9 illustrates a perspective view of a stage in which a planarization layer, a first pixel electrode, a power supply line, and second source and drain electrodes of a second thin film transistor (TFT) are formed on the substrate of FIG. 8.
Figure 10:
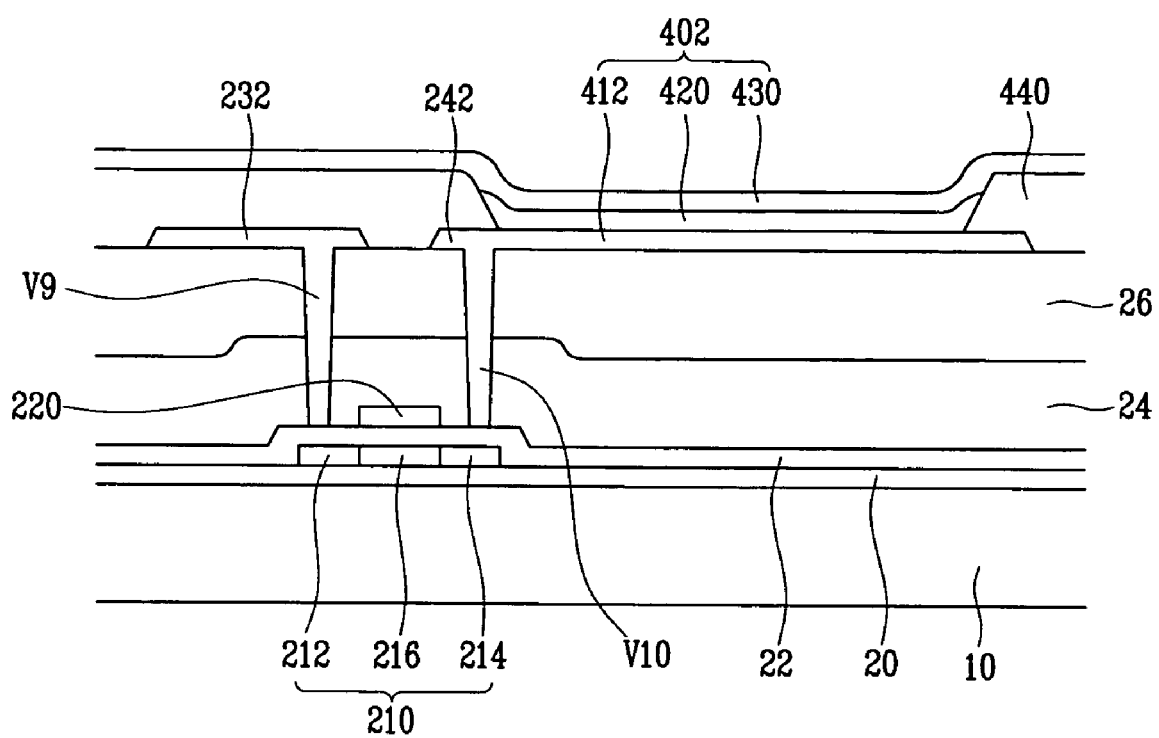
FIG. 10 illustrates a cross-sectional view taken along line X-X of FIG. 9.

FIGS. 8 to 10 illustrate views of stages in a method of fabricating an OLED display according to a second embodiment of the present invention. FIG. 8 illustrates a perspective view of a stage in which portions of source/drain wire lines are formed on the substrate of FIG. 3. FIG. 9 illustrates a perspective view showing a stage in which the planarization layer, the first pixel electrode, the power supply line, and the second source and drain electrodes of the second TFT are formed on the substrate of FIG. 8. FIG. 10 illustrates a cross-sectional view taken along line X-X of FIG. 9, assuming that an organic light emitting element has been formed on the driving circuit of FIG. 9.

In a method of fabricating the OLED display according to the second embodiment, since processes to be performed until the interlayer insulating film 24 is formed may be the same as those in the first embodiment, a detailed description thereof is omitted.

In the second embodiment of the present invention, second source and drain electrodes 232 and 242 of the second TFT, along with a power supply line 342 and a first pixel electrode 412, may be formed on the planarization layer 26.

In this case, the second source electrode 232 and the power supply line 342 may be integrated into a single structure. Thus, the via hole V6 is no longer needed. The second source electrode 232 may be coupled to the source region 212 of the second semiconductor layer 210 through a ninth via hole V9. The second drain electrode 242 and the first pixel electrode 410 may be integrated into a single structure. Thus, the via hole V8 is no longer needed. The second drain electrode 242 may be coupled to the drain region 214 of the second semiconductor layer 210 through a tenth via hole V10.

Figure 11:
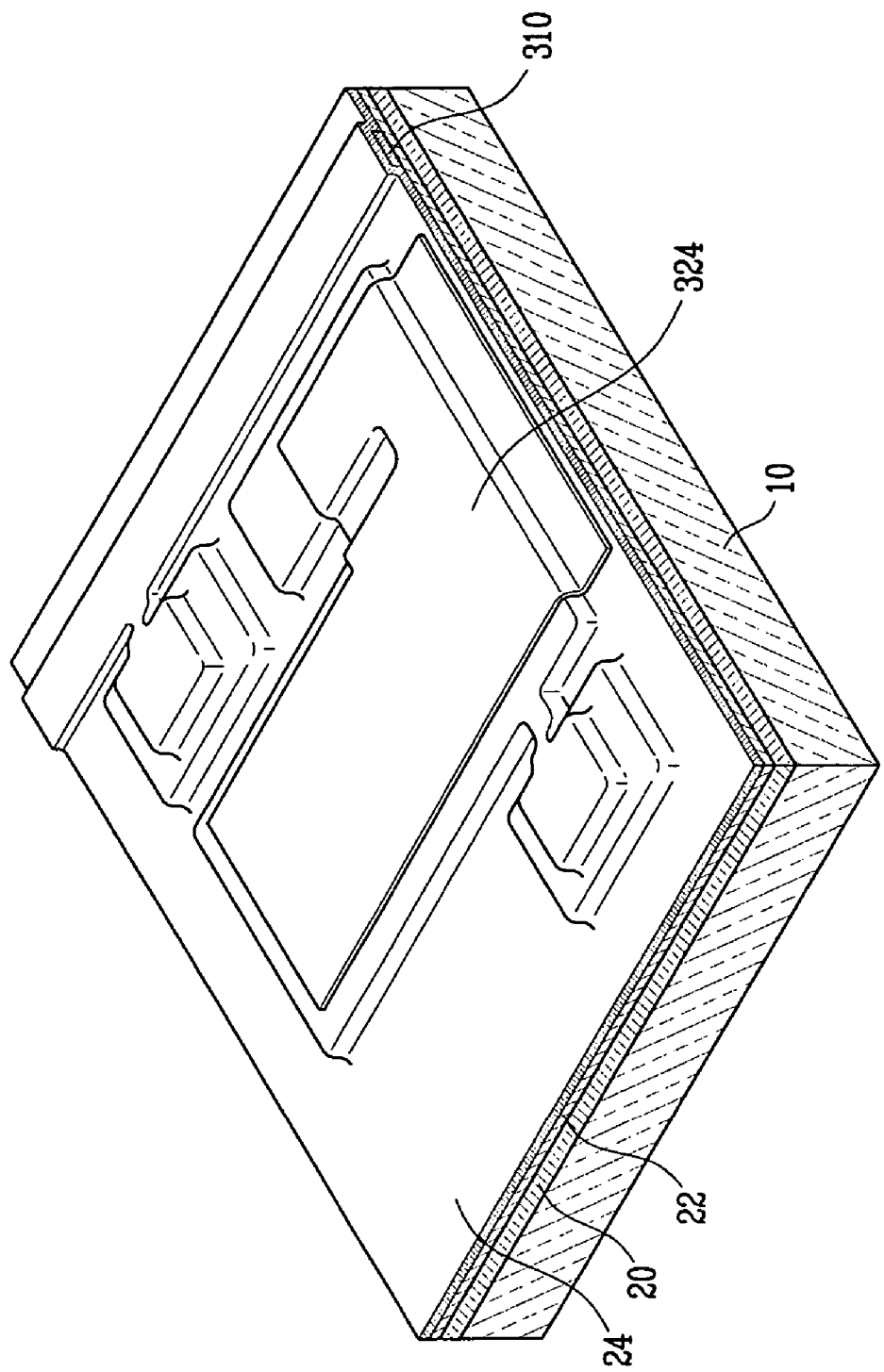
FIG. 11 illustrates a perspective view of a stage in which portions of source/drain wire lines are formed on the substrate of FIG. 3 in a method of fabricating an OLED display according to a third embodiment of the present invention.
Figure 12:
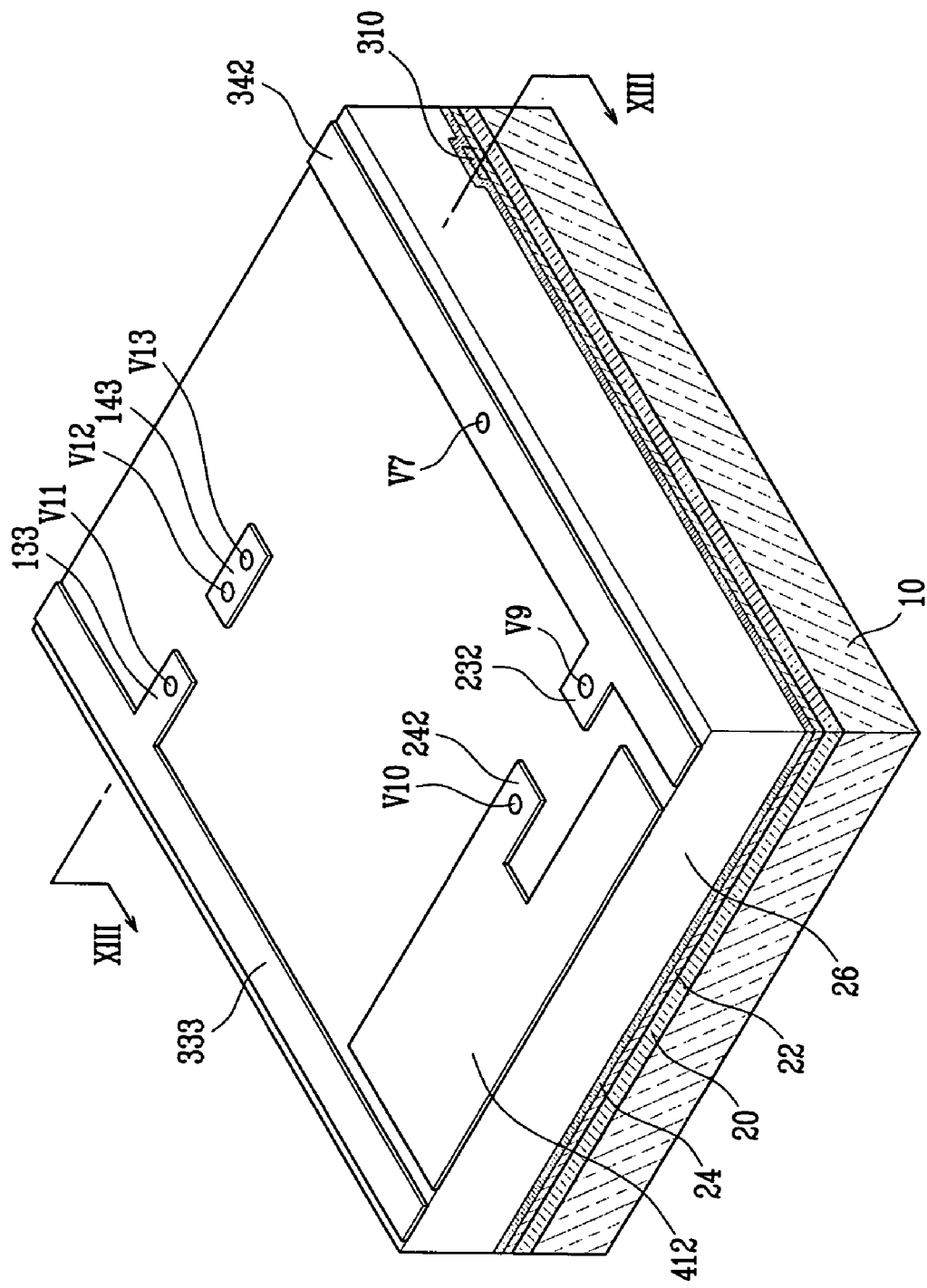
FIG. 12 illustrates a perspective view showing a state in which a planarization layer, a first pixel electrode, a power supply line, first source and drain electrodes of a first TFT, second source and drain electrodes of a second TFT, and a data line are formed on the substrate of FIG. 11.
Figure 13:
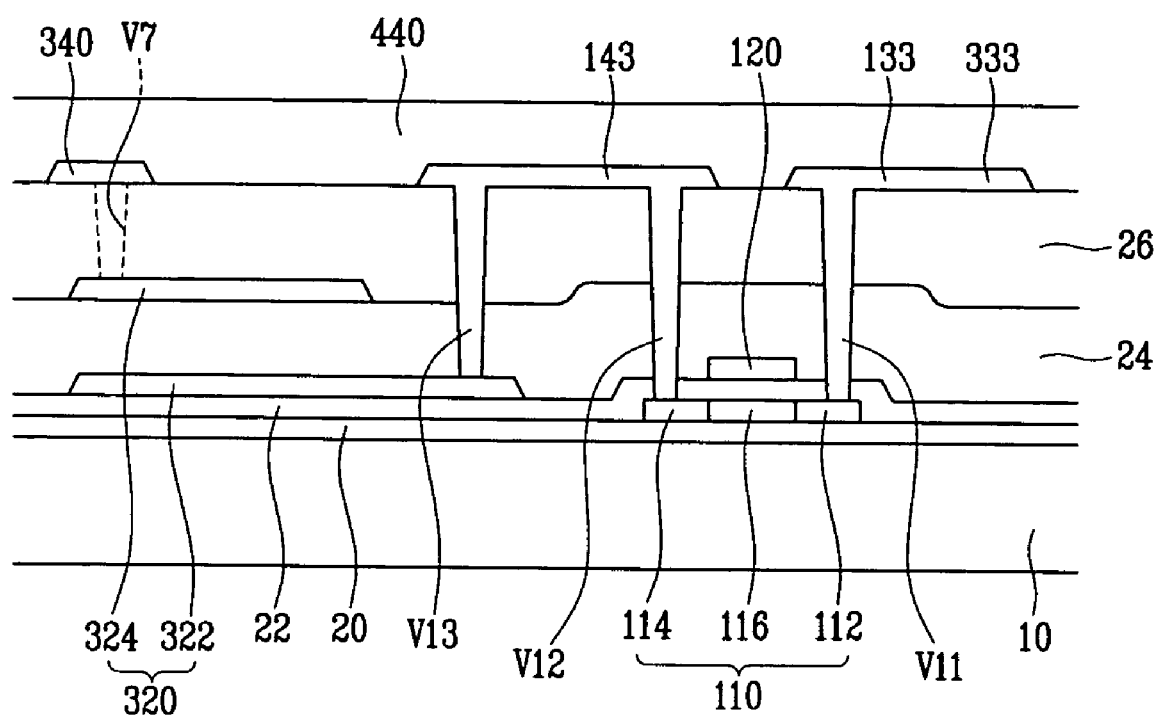
FIG. 13 illustrates a cross-sectional view taken along line XIII-XIII of FIG. 12.

FIGS. 11 to 13 illustrate views of stages of a method of fabricating an OLED display according to a third embodiment of the present invention. FIG. 11 illustrates a perspective view of a stage in which portions of the source/drain wire lines are formed on the substrate of FIG. 3. FIG. 12 illustrates a perspective view of a stage in which the planarization layer, the first pixel electrode, the power supply line, the first source and drain electrodes of the first TFT, the second source and drain electrodes of the second TFT, and the data line are formed on the substrate of FIG. 11. FIG. 13 illustrates a cross-sectional view taken along line XIII-XIII of FIG. 12, assuming that a light emitting element has been formed on the substrate of FIG. 12.

In a method of fabricating the OLED display according to the third embodiment, since the processes to be performed until the interlayer insulating film 24 is formed may be the same as those in the first embodiment, detailed description is omitted.

In the third embodiment of the present invention, first source and drain electrodes 133 and 143 of the first TFT and the data line 333, in addition to the power supply line 342, the second source and drain electrodes 232 and 242 of the second TFT, and the first pixel electrode 412, may be formed on the planarization layer 26.

In this case, the first source electrode 133 of the first TFT may be coupled to the source region 112 of the first TFT through an eleventh via hole V11. The first drain electrode 143 may be coupled to the drain region 114 of the first TFT through a twelfth via hole V12, and may be coupled to the lower electrode 322 of the storage capacitor 320 through a thirteenth via hole V13.

The data line 333 may be integrated with the first source electrode 133 in one body.

Figure 14:
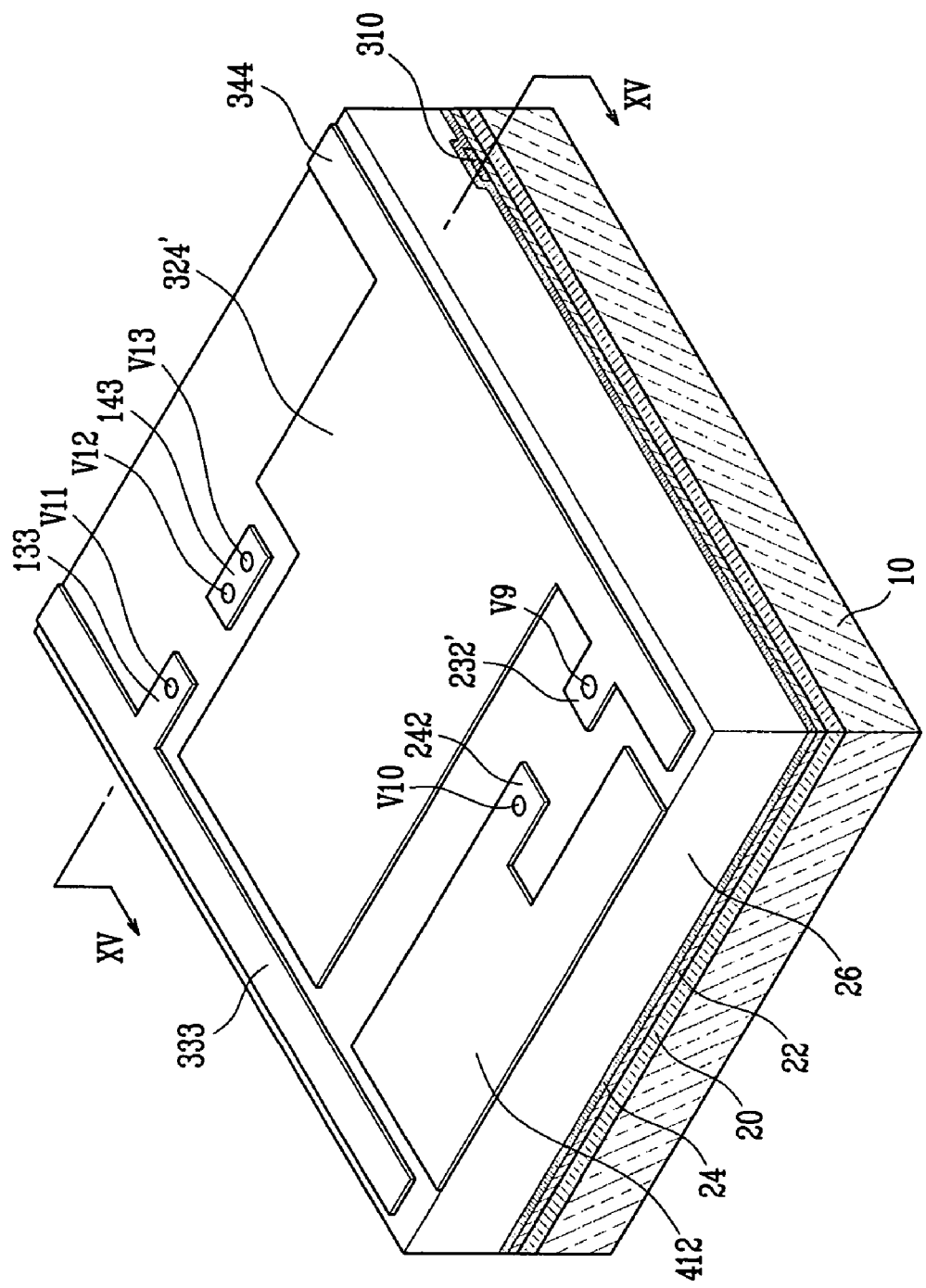
FIG. 14 illustrates a perspective view showing a state in which a planarization layer and source/drain wire lines are formed on the substrate of FIG. 3 in a method of fabricating an OLED display according to a fourth embodiment of the present invention.
Figure 15:
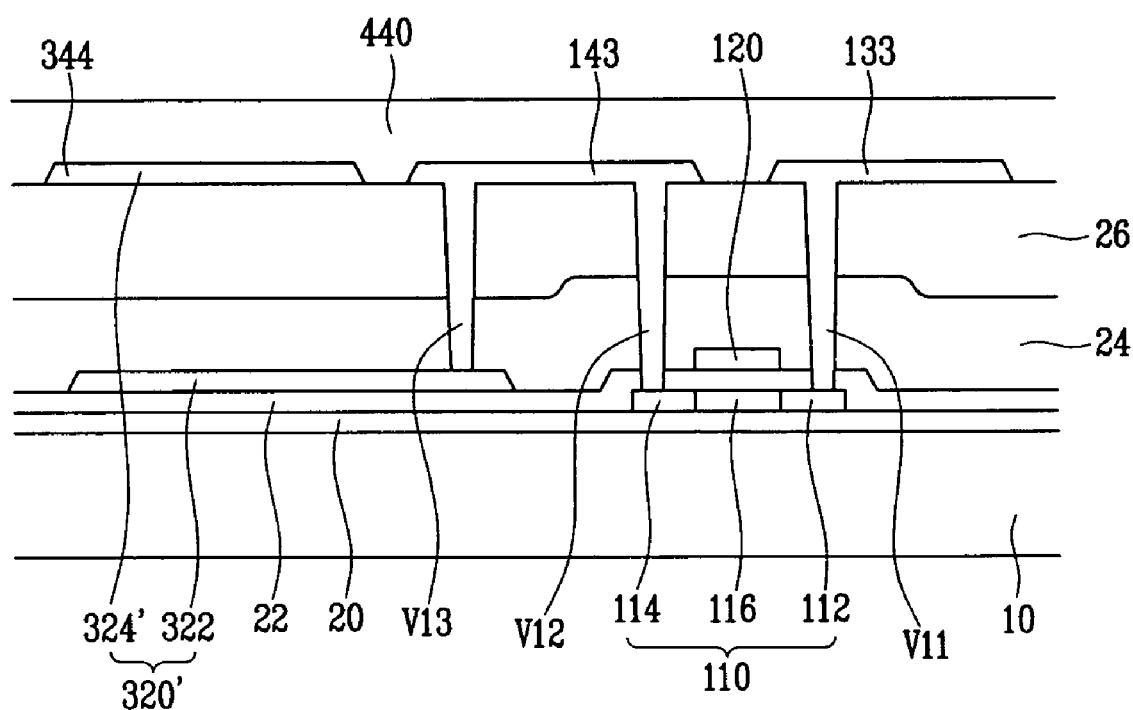
FIG. 15 illustrates a cross-sectional view taken along line XV-XV of FIG. 14.

FIGS. 14 and 15 illustrate views of stages in a method of fabricating an OLED display according to a fourth embodiment of the present invention. FIG. 14 is a perspective view of a stage in which the planarization layer and the source/drain wire lines are formed on the substrate of FIG. 3. FIG. 15 illustrates a cross-sectional view taken along line XV-XV of FIG. 14, assuming that a light emitting element has been formed on the substrate of FIG. 14.

In a method of fabricating the organic light emitting diode display according to the fourth embodiment, since the processes to be performed until the interlayer insulating film 24 is formed are the same as those in the first embodiment, a detailed description thereof is omitted.

In the fourth embodiment of the present invention, the planarization layer 26 is formed on the interlayer insulating film 24, and all of the source/drain wire lines may be formed on the planarization layer 26.

Here, the source/drain wire lines include the first source and drain electrodes 133 and 143 of the first TFT, the data line 333, second source and drain electrodes 232' and 242 of the second TFT, the power supply line 344, and an upper electrode 324' of a storage capacitor 320'. The power supply line 344, the upper electrode 324' and the second drain electrode 232' may be integrated into a single structure. Thus, the via hole V7 is no longer needed.

In the fourth embodiment, the source/drain wire lines and the first pixel electrode 410 may be coplanar, e.g., formed on the same layer, so that the number of masks and/or processes may be reduced. The source/drain wire lines and the first pixel electrode 410 may be made of the same material.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, comprising:
 a pixel driving circuit including a first TFT, a second TFT, and a storage capacitor;
 an organic light emitting element including a first pixel electrode, a second pixel electrode on the first pixel electrode, and an organic layer between the first and the second electrode, the organic light emitting element being on the pixel driving circuit; and
 a power supply line that is coplanar with the first pixel electrode;
 wherein the power supply line is integral with a second source electrode of the second TFT and is coupled to an upper electrode of the storage capacitor.

2. The organic light emitting diode display as claimed in claim 1, wherein the first pixel electrode includes Ag.

3. The organic light emitting diode display as claimed in claim 2, wherein the first pixel electrode includes ITO/Ag/ITO.

4. The organic light emitting diode display as claimed in claim 1, wherein second source and drain electrodes of the second TFT and the power supply line are coplanar.

5. The organic light emitting diode display as claimed in claim 4,
 wherein the upper electrode of the storage capacitor is formed on a layer underneath the power supply line, and
 wherein the first pixel electrode is integral with the drain electrode of the second TFT.

6. The organic light emitting diode display as claimed in claim 5, wherein the first pixel electrode and the power supply line are formed on a planarization layer.

7. The organic light emitting diode display as claimed in claim 5, wherein the first pixel electrode, the power supply line, and the second source and drain electrodes of the second TFT are formed on a planarization layer.

8. The organic light emitting diode display as claimed in claim 5, wherein first source and drain electrodes of the first TFT, a data line, the power supply line, and the second source and drain electrodes of the second TFT are coplanar.

9. The organic light emitting diode display as claimed in claim 8, wherein the first source electrode of the first TFT and the data line are integral.

10. The organic light emitting diode display as claimed in claim 9, wherein the first source and drain electrodes of the first TFT, the data line, the power supply line, and the second source and drain electrodes of the second TFT are formed on a planarization layer.

11. The organic light emitting diode display as claimed in claim 4, wherein first source and drain electrodes of the first TFT, a data line, the power supply line, the second source and drain electrodes of the second TFT, and the upper electrode of the storage capacitor are coplanar.

12. The organic light emitting diode display as claimed in claim 11,
- wherein the power supply line is integral with the second source electrode of the second TFT and the upper electrode of the storage capacitor,
- wherein the first pixel electrode is integral with the second drain electrode of the second TFT, and
- wherein the first source electrode of the first TFT is integral with the data line.

13. The organic light emitting diode display as claimed in claim 12, wherein the first source and drain electrodes of the first TFT, the data line, the power supply line, the second source and drain electrodes of the second TFT, and the upper electrode of the storage capacitor are formed on a planarization layer.

14. A method of fabricating an organic light emitting diode display, the method comprising:
- forming first and second semiconductor layers of first and second TFTs, respectively, on a sub-pixel region of a substrate;
- forming a gate insulating layer;
- forming a first gate electrode of the first TFT, a scan line connected to the first gate electrode, a second gate electrode of the second TFT, and a lower electrode of a storage capacitor connected to the second gate electrode;
- forming an interlayer insulating film;
- forming an upper electrode of the storage capacitor;
- forming a data line;
- forming first source and drain electrodes of the first TFT;
- forming second source and drain electrodes of the second TFT;
- forming a power supply line coupled to the second source electrode and the upper electrode of the storage capacitor;
- forming a first pixel electrode coupled to the second drain electrode, the first pixel electrode being coplanar with the power supply line; and
- sequentially stacking an organic layer and a second pixel electrode on the first pixel electrode;
- wherein forming the power supply line includes integrating the power supply line and the second source electrode of the second TFT.

15. The method as claimed in claim 14, wherein, before forming the power supply line and the first pixel electrode, forming a planarization layer.

16. The method as claimed in claim 15, wherein forming the planarization layer is performed after at least one of forming the interlayer insulating film, the upper electrode of the storage capacitor, the data line, and the first source and drain electrodes of the first TFT.

17. The method as claimed in claim 16, wherein, after forming the planarization layer, forming the second source and drain electrodes of the second TFT, the second source and drain electrodes of the second TFT being coplanar with the power supply line.

18. The method as claimed in claim 17, wherein forming the first pixel electrode includes integrating the first pixel electrode and the second drain electrode.

19. The method as claimed in claim 17, wherein, after forming the planarization layer, forming the first source and drain electrodes of the first TFT, and forming the data line, the first source and drain electrodes of the first TFT and the data line being coplanar with the power supply line.

20. The method as claimed in claim 19, wherein forming the power supply line includes integrating the power supply line and the second source electrode, forming the first pixel electrode includes integrating the first pixel electrode and the second drain electrode, and forming the first source electrode includes integrating the first source electrode and the data line.

21. The method as claimed in claim 19, wherein, after forming the planarization layer, forming the upper electrode of the storage capacitor, the upper electrode of the storage capacitor being coplanar with the power supply line.

22. The method as claimed in claim 21, wherein forming the power supply line includes integrating the power supply line, the second source electrode and the upper electrode of the storage capacitor, forming the first pixel electrode includes integrating the first pixel electrode and the second drain electrode, and forming the first source electrode includes integrating the first source electrode and the data line.

23. An organic light emitting diode display, comprising:
- a pixel driving circuit including a first TFT, a second TFT, and a storage capacitor;
- an organic light emitting element including a first pixel electrode, a second pixel electrode on the first pixel electrode, and an organic layer between the first and the second electrode, the organic light emitting element being on the pixel driving circuit; and
- a power supply line that is coplanar with and made of a same material as the first pixel electrode.

* * * * *